(12) United States Patent
Mallick

(10) Patent No.: US 8,580,699 B2
(45) Date of Patent: Nov. 12, 2013

(54) EMBEDDED CATALYST FOR ATOMIC LAYER DEPOSITION OF SILICON OXIDE

(75) Inventor: Abhijit Basu Mallick, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 174 days.

(21) Appl. No.: 13/197,517

(22) Filed: Aug. 3, 2011

(65) Prior Publication Data

US 2012/0196451 A1      Aug. 2, 2012

Related U.S. Application Data

(60) Provisional application No. 61/381,889, filed on Sep. 10, 2010.

(51) Int. Cl.
*H01L 21/31* (2006.01)

(52) U.S. Cl.
USPC .......................................... 438/778; 438/787

(58) Field of Classification Search
CPC ..................... H01L 21/02164; H01L 21/0228
USPC .......................................... 438/758, 778, 787
See application file for complete search history.

(56) References Cited

U.S. PATENT DOCUMENTS

| | | | |
|---|---|---|---|
| 6,090,442 | A | 7/2000 | Klaus et al. |
| 6,858,533 | B2 | 2/2005 | Chu et al. |
| 7,077,904 | B2 | 7/2006 | Cho et al. |
| 7,749,574 | B2 | 7/2010 | Mahajani et al. |
| 2003/0023113 | A1 | 1/2003 | Druzkowski et al. |
| 2004/0180557 | A1* | 9/2004 | Park et al. ..................... 438/787 |
| 2006/0090694 | A1 | 5/2006 | Cho et al. |
| 2009/0209081 | A1* | 8/2009 | Matero et al. ................. 438/400 |
| 2010/0221428 | A1 | 9/2010 | Dussarrat |

OTHER PUBLICATIONS

Morishita, S. et al., "Atomic-Layer Chemical-Vapor-Deposition of $SiO_2$ by Cyclic Exposures of $CH_3OSi$ (NCO) and $H_2O_2$", Jpn. J. Appl. Phys., Oct. 1995, vol. 34, Part 1, No. 10, pp. 5738-5742.
Notification of Transmittal of the International Search Report and the Written Opinion of the International Searching Authority, Or the Declaration; International Search Report and Written Opinion of the International Searching Authority for corresponding International Application No. PCT/US2011/050391 mailed on Mar. 28, 2012, 9 pages.

* cited by examiner

*Primary Examiner* — Khiem D Nguyen
(74) *Attorney, Agent, or Firm* — Kilpatrick Townsend & Stockton LLP

(57) ABSTRACT

Catalyzed atomic layer deposition from a reduced number of precursors is described. A deposition precursor contains silicon, oxygen and a catalytic ligand. A hydroxyl-terminated substrate is exposed to the deposition precursor to form a silicon bridge bond between two surface-bound oxygens. The surface-bound oxygens were part of two surface-bound hydroxyl groups and the adsorption of the deposition precursor liberates the hydrogens. The silicon atom is also chemically-bound to one or two additional oxygen atoms which were already chemically-bound to the silicon within a same deposition precursor molecule. At least one of the additional oxygen atoms is further chemically-bound to the catalytic ligand either directly or by way of a hydrocarbon chain. Further exposure of the substrate to moisture ($H_2O$) results in displacement of the additional oxygen which are replaced by hydroxyl groups from the moisture. The surface is again hydroxyl-terminated and the process may be repeated. The catalytic nature of the reaction enables the deposition to occur at low substrate temperatures. The chemically-embedded nature of the catalyst increases the deposition per cycle thereby reducing the number of precursor exposures to grow a film of the same thickness.

19 Claims, 3 Drawing Sheets

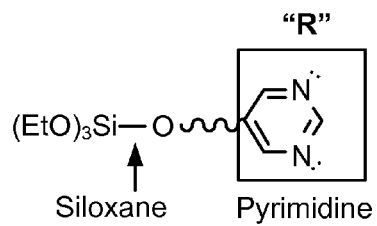
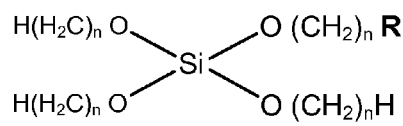
FIG 2A
FIG 2B
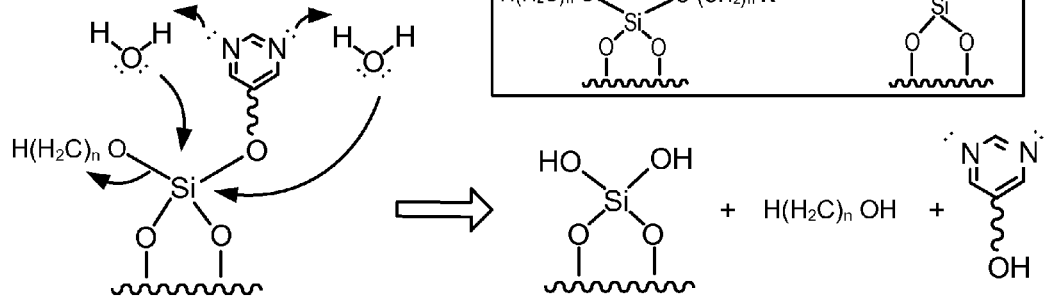
FIG 2C
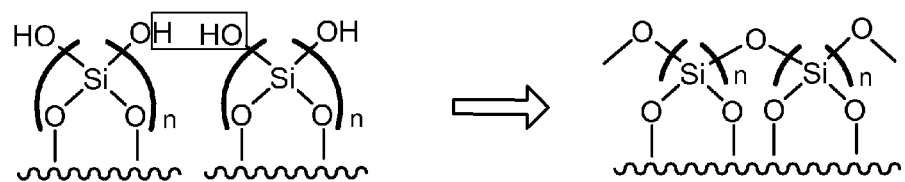
FIG 2D

EMBEDDED CATALYST FOR ATOMIC LAYER DEPOSITION OF SILICON OXIDE

CROSS-REFERENCES TO RELATED APPLICATIONS

This application claims the benefit of U.S. Provisional Patent Application No. 61/381,889 filed Sep. 10, 2010, and titled "EMBEDDED CATALYST FOR ATOMIC LAYER DEPOSITION OF SILICON OXIDE," which is incorporated herein by reference in its entirety for all purposes.

BACKGROUND OF THE INVENTION

Silicon oxide dielectric films form resilient interfaces with silicon and provide high dielectric strength and a relatively low dielectric constant. These traits result in heavy use of silicon oxide for insulating electrically active features from one another. Two conventional methods for depositing a silicon oxide film include: (1) oxidation process wherein silicon is oxidized at relatively high temperatures (e.g., sometimes more than 1000° C.); and (2) a chemical vapor deposition (CVD) process wherein the silicon and oxygen sources are introduced into a chamber and exposed to energy (e.g., heat) to form a silicon oxide film. Silicon oxide CVD processes typically occur at temperatures ranging from 600° C. to 800° C. or below 450° C. depending on the application. While satisfactory for larger integrated circuit linewidths, these methods can cause diffusion at interfaces due to the high deposition temperature, thereby degrading electrical characteristics of miniature electrical devices.

In addition to lower substrate temperatures, thin films used in semiconductor devices will increasingly require atomic layer control during deposition due to the decreasing linewidths. These thin films will also be required to have excellent step coverage and conformality. To satisfy the requirements, atomic layer deposition (ALD) process have gained traction in semiconductor manufacturing.

ALD silicon oxide films have been deposited at a temperature of more than 600K via the atomic layer deposition process using $SiCl_4$ and $H_2O$ sources. In this exemplary prior art process, a $SiCl_4$ source is provided in a substrate processing region containing a substrate having hydroxyl groups (—OH) on its surface. The $SiCl_4$ source reacts with the hydroxyl group in this first deposition step, and —$SiCl_3$ is adsorbed on the surface of the substrate, HCl by-products are formed. When the reaction of $SiCl_4$ with the hydroxyl group is essentially complete, a monolayer of Si has been added to the surface of the substrate. Further exposure to $SiCl_4$ results in insignificant additional deposition. Such a reaction is referred to as self-limiting. At this point, the surface of the substrate is terminated with —$SiCl_3$ surface chemical species.

An $H_2O$ source is then flowed into the substrate processing region. $H_2O$ reacts with the —$SiCl_3$ surface chemical species to generate adsorption of the hydroxyl group thereto and HCl by-products. A monolayer of oxygen has now been added on top of the previously deposited monolayer of silicon. This second deposition step is also self-limiting; further exposure to $H_2O$ results in little additional deposition. These two deposition steps may be repeated to deposit a silicon oxide film having a desired thickness. This prior art deposition method is limited to relatively high substrate temperature and low growth rates.

A catalyst, e.g. pyridine, may be introduced sequentially, following exposure of the surface to the silicon source described above in order to facilitate deposition at lower substrate temperatures. ALD has been performed in this way at substrate temperatures below 200° C. Introducing an additional step, however, further reduces the already low deposition rate. Concurrent exposure to multiple deposition precursors does not significantly address the low growth and sacrifices the atomic layer control desired for most ALD processes. Furthermore, the presence of chlorine and ammonia in the effluents produces undesirable salts which can incorporate into the depositing film in addition to requiring specialized deposition chamber cleaning procedures. Alternative silicon precursors which do not contain chlorine address the production of undesirable salts but do not address the low growth rates.

Thus, there remains a need for new atomic layer deposition processes and materials to form relatively pure dielectric materials at low temperatures but increased growth rates. This and other needs are addressed in the present application.

BRIEF SUMMARY OF THE INVENTION

Catalyzed atomic layer deposition from a reduced number of precursors is described. A deposition precursor contains silicon, oxygen and a catalytic ligand. A hydroxyl-terminated substrate is exposed to the deposition precursor to form a silicon bridge bond between two surface-bound oxygens. The surface-bound oxygens were part of two surface-bound hydroxyl groups and the adsorption of the deposition precursor liberates the hydrogens. The silicon atom is also chemically-bound to one or two additional oxygen atoms which were already chemically-bound to the silicon within a same deposition precursor molecule. At least one of the additional oxygen atoms is further chemically-bound to the catalytic ligand either directly or by way of a hydrocarbon chain. Further exposure of the substrate to moisture ($H_2O$) results in displacement of the additional oxygen which are replaced by hydroxyl groups from the moisture. The surface is again hydroxyl-terminated and the process may be repeated. The catalytic nature of the reaction enables the deposition to occur at low substrate temperatures. The chemically-embedded nature of the catalyst increases the deposition per cycle thereby reducing the number of precursor exposures to grow a film of the same thickness.

Embodiments of the invention include methods of forming a silicon oxide layer on a hydroxyl-terminated surface of a substrate positioned in a substrate processing region. The methods include at least four sequential steps: (i) exposing the hydroxyl-terminated surface to a silicon-and-oxygen-containing precursor comprising a siloxane and a nitrogen-containing catalytic ligand by flowing the silicon-and-oxygen-containing precursor into the substrate processing region, (ii) removing process effluents including unreacted silicon-and-oxygen-containing precursor from the substrate processing region, (iii) exposing the surface of the substrate by flowing $H_2O$ into the substrate processing region, and (iv) removing process effluents including unreacted $H_2O$ from the substrate processing region. The methods further include repeating the at least four sequential steps until the silicon oxide layer reaches a target thickness.

Embodiments of the invention include methods of forming a silicon oxide layer on a hydroxyl-terminated surface of a substrate within a substrate processing region. The methods include performing a cycle of atomic layer deposition comprising the sequential steps: (1) flowing a silicon-and-oxygen-containing precursor containing silicon-and-oxygen-containing molecules into the substrate processing region to form a bridge bonded silicon atom bridging between two surface-bound oxygen adatoms, wherein the two surface-bound oxygen adatoms originated within separate hydroxyl termination groups, and then (2) flowing $H_2O$ into the substrate processing region to bind hydroxyl groups to each of the two remaining sites of the bridge-bonded silicon atom. The silicon-and-oxygen-containing molecules further include a catalytic ligand, which enables the $H_2O$ to cleave the Si—O bond and further enables a hydroxyl group from the $H_2O$ to chemically bind to the cleaved site of the bridge-bonded silicon atom.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

FIG. 2A is a chemical schematic of a silicon-and-oxygen-containing molecule for use in atomic layer deposition according to disclosed embodiments.

FIG. 2B is a chemical schematic of a silicon-and-oxygen-containing molecule for use in atomic layer deposition according to disclosed embodiments.

FIG. 2C is a chemical schematic of a step in an atomic layer deposition process according to disclosed embodiments.

FIG. 2D is a chemical schematic of a termination step in an atomic layer deposition process according to disclosed embodiments.

DETAILED DESCRIPTION OF THE INVENTION

Catalyzed atomic layer deposition from a reduced number of precursors is described. A deposition precursor contains silicon, oxygen and a catalytic ligand. A hydroxyl-terminated substrate is exposed to the deposition precursor to form a silicon bridge bond between two surface-bound oxygens. The surface-bound oxygens were part of two surface-bound hydroxyl groups and the adsorption of the deposition precursor liberates the hydrogens. The silicon atom is also chemically-bound to one or two additional oxygen atoms which were already chemically-bound to the silicon within a same deposition precursor molecule. At least one of the additional oxygen atoms is further chemically-bound to the catalytic ligand either directly or by way of a hydrocarbon chain. Further exposure of the substrate to moisture ($H_2O$) results in displacement of the additional oxygen which are replaced by hydroxyl groups from the moisture. The surface is again hydroxyl-terminated and the process may be repeated. The catalytic nature of the reaction enables the deposition to occur at low substrate temperatures. The chemically-embedded nature of the catalyst increases the deposition per cycle thereby reducing the number of precursor exposures to grow a film of the same thickness.

Figure 1:
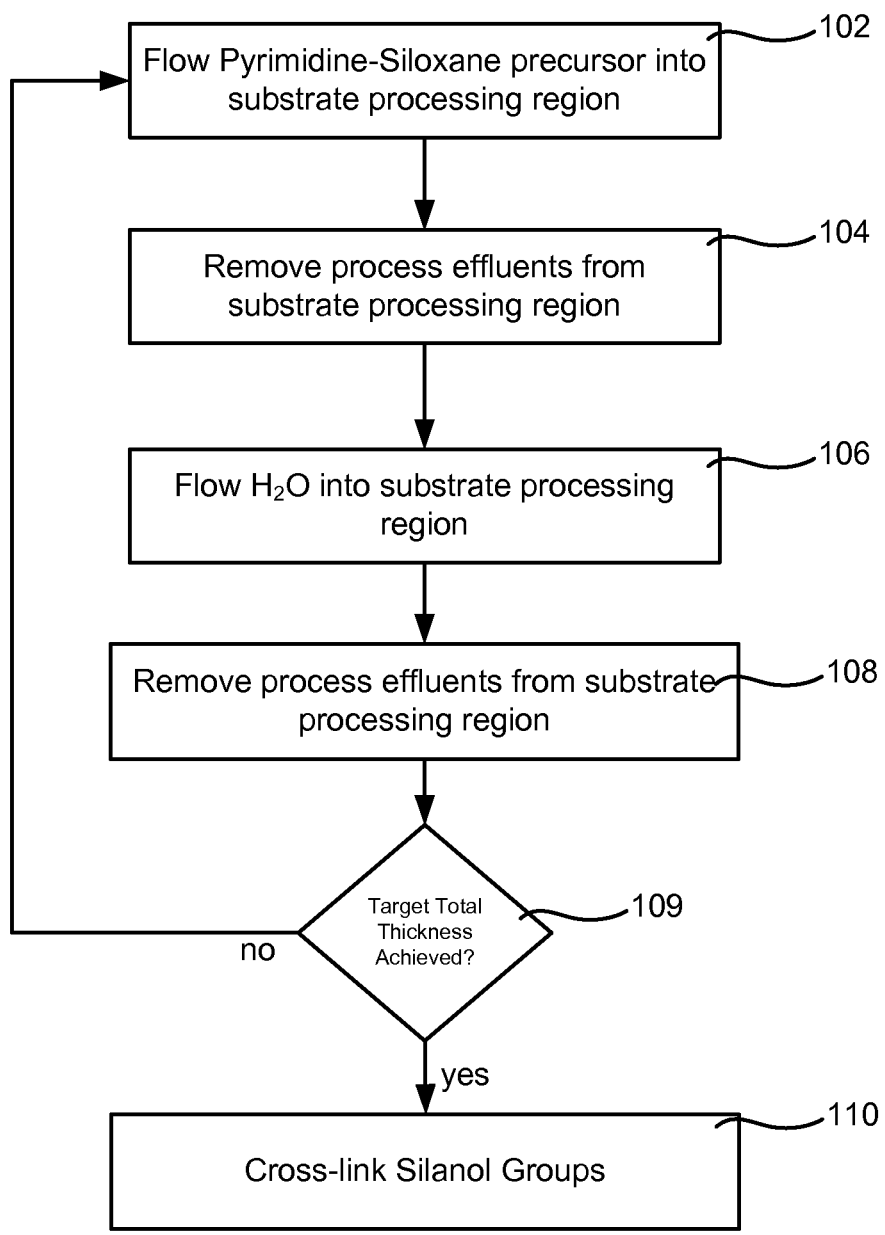
FIG. 1 is a flowchart illustrating selected steps for forming silicon oxide dielectric layers according to disclosed embodiments.

In order to better understand and appreciate the invention, reference is now made to FIGS. 1-2 which are a flowchart showing exemplary selected steps for performing atomic layer deposition and chemical schematics during the deposition according to embodiments of the invention. The method 100 includes flowing a precursor which includes pyrimidine siloxane ($H(CH_2)_nO$-pyrimidine, see FIG. 2A) into a substrate processing region containing a substrate (step 102). Siloxane and akloxysilane are interchangeably used herein and, as such, pyrimidine siloxane may also be referred to as pyrimidine alkoxysilane. The substrate is terminated with hydroxyl groups prior to the introduction of the pyrimidine siloxane. The pyrimidine is a nitrogen-containing catalytic ligand, in disclosed embodiments, and an alternative representation of pyrimidine siloxane is shown in FIG. 2B. Generally speaking, a silicon-and-oxygen-containing precursor may be used for this step and the silicon-and-oxygen-containing precursor may be pyrimidine siloxane in disclosed embodiments. The silicon-and-oxygen-containing molecules of the silicon-and-oxygen-containing precursor may each contain four oxygen atoms chemically-bound to one silicon atom. Three of the oxygen atoms may each be chemically-bound to a separate hydrocarbon chain and the remaining oxygen atom may be chemically-bound to the catalytic ligand either directly or through a hydrocarbon chain in embodiments of the invention. The hydrocarbon chains may have the same or different lengths. The lengths of one, some or all the hydrocarbon chains may be zero in embodiments. As the pyrimidine siloxane approaches the hydroxyl-terminated substrate, a bridge-bond is formed between two surface-bound oxygen atoms by the silicon atom in the precursor. The two hydrogens from the two hydroxyl groups are liberated along with several process effluents. One hydrocarbon chain remains on the surface-bound structure. The nitrogen-containing catalytic ligand is also chemically bound to the surface via an oxygen atom (see inset of FIG. 2C). Exposing the substrate to pyrimidine siloxane is a self-limiting step in embodiments, meaning further exposure to pyrimidine siloxane beyond a certain point makes essentially no further chemical change to the surface. The deposition amount plateaus after a period of time in a self-limiting process like this.

Unreacted pyrimidine siloxane and other process effluents are removed from the substrate processing region in step 104. The process effluents may be removed by flowing inert species into the substrate processing region to flush the process effluents away from the processing region. Alternatively or in combination, the process effluents may be pumped away through a pumping port to a pumping system.

At this point, a catalytic exposure would have been needed if catalytic ligands were not present in the deposition precursor. Instead, moisture ($H_2O$) is flowed into the substrate processing region (step 106) to perform the next step in atomic layer deposition. A water molecule ($H_2O$) impacting the surface interacts with a nitrogen in the pyrimidine adsorbed on the surface of the substrate (see FIG. 2C). The interaction allows the water to cleave the Si—O bond of below the hydrocarbon chain (the one without the catalytic ligand attached). Cleavage of the Si—O bond liberates a hydrocarbon chain having an attached hydroxyl group. The reaction forms a bond between the silicon bridge atom and the oxygen of the water. Meanwhile a second water molecule interacts with one or both of the nitrogen atoms in the catalytic ligand, resulting in cleavage of the Si—O bond affiliated with the same catalytic ligand which enabled the reaction. The interaction liberates the catalytic ligand and its hydrocarbon chain as a process effluent. The open bonding site created by the liberation is then occupied by a hydroxyl group from the second water molecule. Exposing the substrate to moisture is a self-limiting step in embodiments, meaning further exposure to $H_2O$ beyond a certain point makes essentially no further chemical change to the surface.

Process effluents including unreacted $H_2O$ are removed from the substrate processing region in step 108. The process effluents may be removed by flowing inert species into the substrate processing region to flush the process effluents away from the processing region. Alternatively or in combination, the process effluents may be pumped away through a pumping port to a pumping system. The four sequential steps (steps 102-108) can be repeated until a target thickness is achieved (decision 109). The deposition sequence comprising the repeated application of the four sequential steps produces a silicon oxide layer on the substrate.

Once the target thickness is achieved, the last hydroxyl-terminated surface can be treated to cross-link the oxygens and liberate hydrogen (step 110). This can be done in a variety of ways including heating or exposing the hydroxyl-terminated surface to an oxygen-plasma. The cross-linking is depicted schematically in FIG. 2D.

The atomic layer deposition process discussed in conjunction with FIGS. 1-2 results in high efficiency since the catalytic agent is incorporated on the deposition precursor. This greatly increases the probability that a catalytic agent will be nearby (available) to facilitate the chemical incorporation of a hydroxyl group from the moisture ($H_2O$). This increased efficiency enables lower substrate temperatures and pressures to be used during both flowing the silicon-and-oxygen-containing precursor (i.e. the pyrimidine siloxane) and the moisture ($H_2O$). Reduced pressure not only decreases the amount of precursor needed to perform the reaction, it also increases the speed with which process effluents may be removed from the substrate processing region. A cycle of atomic layer deposition (steps 102-108) lasts less than 2 seconds in disclosed embodiments. The increased efficiency also allows additional material to be deposited within each cycle compared to atomic layer deposition cycles performed without an embedded catalyst. A cycle of atomic layer deposition (four sequential steps 102-108) deposits more than 1 Å, less than 6 Å or between 1 Å and 6 Å of silicon oxide on the substrate in disclosed embodiments. The pressure within the substrate processing region is below 10 mTorr during one or both of the steps of flowing the silicon-and-oxygen-containing precursor and flowing the moisture ($H_2O$) in disclosed embodiments. The substrate temperature may be less than 200° C. during both of the steps of flowing the silicon-and-oxygen-containing precursor and flowing the moisture ($H_2O$) in embodiments of the invention.

Figure 3A:
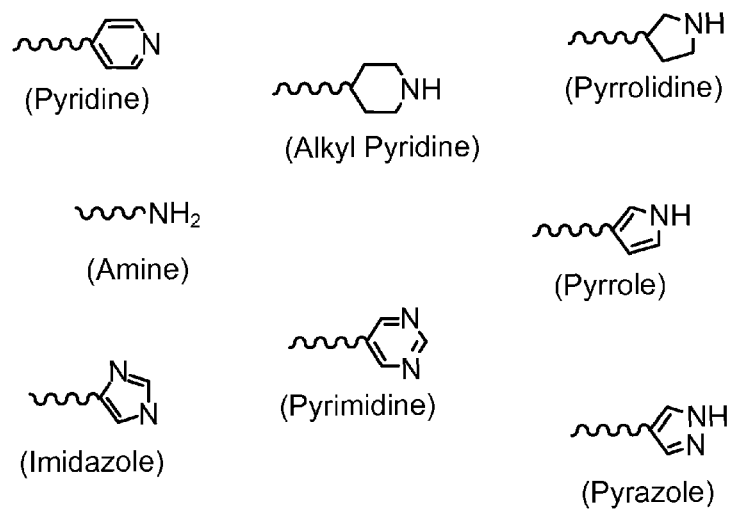
FIG. 3A is a chemical schematic of catalytic ligands and optional hydrocarbon chains in silicon-and-oxygen-containing molecules for use in atomic layer deposition according to disclosed embodiments.
Figure 3B:
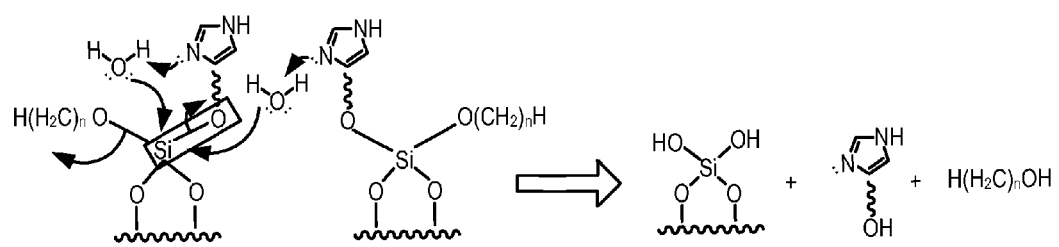
FIG. 3B is a chemical schematic of a step in an atomic layer deposition process according to disclosed embodiments.

The benefits and process parameters described above extend to a wider variety of silicon-and-oxygen-containing precursors than pyrimidine siloxane. Exemplary catalytic ligands are represented along with optional hydrocarbon chains in chemical schematics in FIG. 3A. Exemplary catalytic ligands include amine, imidazole, alkyl pyridine, pyridine, pyrimidine (as discussed above), pyrrolidine, pyrrole and pyrazole, in disclosed embodiments. Each of these catalytic ligands contains at least one nitrogen and several have more. Most of these catalytic ligands contain a carbon-nitrogen ring which may be referred to as an aromatic carbon-nitrogen ring. A carbon-nitrogen ring may facilitate the catalysis of the Si—O bond of the bridge-bonded silicon. A supplementary example involving the imidazole catalytic ligand is shown in FIG. 3B. The nitrogen in the aromatic carbon-nitrogen ring enables an incoming water molecule to cleave one of the Si—O bonds (the schematic indicates the Si—O on the left is broken—not necessarily the case). Cleavage of the Si—O bond liberates a hydroxyl-hydrocarbon chain molecule and forms a bond between the silicon bridge atom and the oxygen of the water. Using an imidazole catalytic ligand (FIG. 3B) instead of a pyrimidine catalytic ligand (FIG. 2C) may have different kinetic behavior since the second water molecule ($H_2O$) may be more easily catalyzed by a nitrogen from an imidazole catalytic ligand chemically-bound to a neighboring oxygen bridge site. Each of the catalytic ligands provide varying kinetic rates of reaction but all offer favorable deposition rates compared to the use of a separate catalyzer due to the embedded nature of the catalytic ligand.

Hydrocarbon chains may or may not be present on each of the four oxygens of a self-catalyzing silicon-and-oxygen-containing precursor according to embodiments of the invention. Exemplary hydrocarbon chains include $H(H_2C)_n$ with n being any positive integer or zero. Therefore, the hydrocarbon chains may include H, $CH_3$, $C_2H_5$, $C_3H_7$ and so on. The hydrocarbon chains may have only single bonds and n may range from 0 to 5 in embodiments of the invention. As indicated previously, the catalytic ligand may be attached to a siloxane directly or by way of a hydrocarbon chain of the form $(H_2C)_n$. The hydrocarbon chain, in cases where n is greater than zero, is not included as part of catalytic ligand ("R") for the purposes of describing the chemical reaction. The hydrocarbon chain attaching the oxygen to the catalytic ligand may be referred to herein as a hydrocarbon extension and may also range from 0 to 5 in embodiments of the invention. As such, the hydrocarbon extensions may include no extension, $CH_2$, $C_2H_4$, $C_3H_6$ and so on.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A layer of "silicon oxide" is used as a shorthand for and interchangeably with a silicon-and-oxygen-containing material. As such, silicon oxide may include concentrations of other elemental constituents such as nitrogen, hydrogen, carbon and the like. In some embodiments, silicon oxide consists essentially of silicon and oxygen. The term "precursor" is used to refer to any process gas which takes part in a reaction to either remove material from or deposit material onto a surface. A gas in an "excited state" describes a gas wherein at least some of the gas molecules are in vibrationally-excited, dissociated and/or ionized states. A "gas" (or a "precursor") may be a combination of two or more gases (or "precursors") and may include substances which are normally liquid or solid but temporarily carried along with other "carrier gases." The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The term "trench" is used throughout with no implication that the etched geometry has a large horizontal aspect ratio. Viewed from above the surface, trenches may appear circular, oval, polygonal, rectangular, or a variety of other shapes. The term "via" is used to refer to a low aspect ratio trench (as viewed from above) which may or may not be filled with metal to form a vertical electrical connection. As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursor and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of forming a silicon oxide layer on a hydroxyl-terminated surface of a substrate positioned in a substrate processing region, the method comprising:
    at least four sequential steps comprising:
    (i) exposing the hydroxyl-terminated surface to a silicon-and-oxygen-containing precursor comprising a siloxane and a nitrogen-containing catalytic ligand comprising a carbon-nitrogen ring by flowing the silicon-and-oxygen-containing precursor into the substrate processing region,
    (ii) removing process effluents including unreacted silicon-and-oxygen-containing precursor from the substrate processing region,
    (iii) exposing the surface of the substrate by flowing $H_2O$ into the substrate processing region, and
    (iv) removing process effluents including unreacted $H_2O$ from the substrate processing region; and
    repeating the at least four sequential steps until the silicon oxide layer reaches a target thickness.

2. The method of claim 1, wherein each iteration of steps (i)-(iv) deposits between 1Å and 6Å of silicon oxide on the substrate.

3. The method of claim 1, wherein the catalytic ligand comprises one nitrogen atom and either 4 or 5 carbon atoms arranged in the carbon-nitrogen ring.

4. The method of claim 1, wherein the catalytic ligand comprises two nitrogen atoms and either 3 or 4 carbon atoms arranged in the carbon-nitrogen ring.

5. The method of claim 1, wherein the pressure within the substrate processing region is below 10 mTorr during one of flowing the silicon-and-oxygen-containing precursor and flowing the $H_2O$.

6. The method of claim 1, wherein a temperature of the substrate is below 200° C. during each of flowing the silicon-and-oxygen-containing precursor and flowing the $H_2O$.

7. The method of claim 1, wherein one of the plurality of cycles of atomic layer deposition lasts for 2 seconds or less.

8. The method of claim 1, wherein the substrate is a patterned substrate having a trench with a width of about 25 nm or less.

9. A method of forming a silicon oxide layer on a hydroxyl-terminated surface of a substrate positioned in a substrate processing region, the method comprising:
    at least four sequential steps comprising:
    (i) exposing the hydroxyl-terminated surface to a silicon-and-oxygen-containing precursor comprising a siloxane and a nitrogen-containing catalytic ligand by flowing the silicon-and-oxygen-containing precursor into the substrate processing region,
    (ii) removing process effluents including unreacted silicon-and-oxygen-containing precursor from the substrate processing region,
    (iii) exposing the surface of the substrate by flowing $H_2O$ into the substrate processing region, and
    (iv) removing process effluents including unreacted $H_2O$ from the substrate processing region; and
    repeating the at least four sequential steps until the silicon oxide layer reaches a target thickness; wherein silicon-and-oxygen-containing molecules from the silicon-and-oxygen containing precursor each contain four oxygen atoms chemically-bound to one silicon atom, wherein three of the oxygen atoms are each chemically-bound to a separate hydrocarbon chain and the remaining oxygen atom is chemically-bound to the catalytic ligand.

10. The method of claim 9, wherein the catalytic ligand comprises a carbon-nitrogen ring.

11. The method of claim 9, wherein the catalytic ligand is chemically-bound to a hydrocarbon extension and the hydrocarbon extension is chemically-bound to an oxygen atom in the siloxane.

12. The method of claim 9, wherein the silicon-and-oxygen-containing precursor comprises pyrimidine-alkoxysilane.

13. The method of claim 9, wherein the catalytic ligand comprises one of Pyrimidine, Imidazole, Amine, Alkyl Pyridine, Pyridine, Pyrrolidine, Pyrrole or Pyrazole.

14. A method of forming a silicon oxide layer on a hydroxyl-terminated surface of a substrate within a substrate processing region, the method comprising:
    performing a plurality of cycles of atomic layer deposition, each cycle comprising the sequential steps:
    (1) flowing a silicon-and-oxygen-containing precursor containing silicon-and-oxygen -containing molecules into the substrate processing region to form a bridge bonded silicon atom bridging between two surface-bound oxygen adatoms, wherein the two surface-bound oxygen adatoms originated within separate hydroxyl termination groups, and then (2) flowing $H_2O$ into the substrate processing region to bind hydroxyl groups to each of two remaining sites of the bridge-bonded silicon atom, wherein the silicon-and-oxygen-containing molecules further comprise a catalytic ligand, which enables the $H_2O$ to cleave a Si—O bond to the bridge bonded silicon atom and further enables a hydroxyl group from the $H_2O$ to chemically bind to the cleaved site of the bridge-bonded silicon atom.

15. The method of claim 14, wherein one of the plurality of cycles of atomic layer deposition deposits between 1Å and 6Å of silicon oxide on the substrate.

16. The method of claim 14, further comprising selecting an integral number of the plurality of cycles to achieve a target thickness of the silicon oxide layer.

17. The method of claim 14, further comprising cross-linking a last hydroxyl-terminated surface by heating the substrate or exposing the substrate to an oxygen plasma to produce a bridge bonded oxygen.

18. The method of claim 14, wherein the catalytic ligand which enables a hydroxyl group to bind to a first bridge-bonded silicon atom is chemically-bound to a second bridge-bonded silicon atom, nearby but different from the first bridge-bonded silicon atom.

19. The method of claim 14, wherein the catalytic ligand which enables a hydroxyl group to bind to a first bridge-bonded silicon atom is chemically-bound to the first bridge-bonded silicon atom.

* * * * *